(12) United States Patent
Okuda

(10) Patent No.: US 6,526,087 B1
(45) Date of Patent: Feb. 25, 2003

(54) DISTRIBUTED FEEDBACK SEMICONDUCTOR LASER

(75) Inventor: Tetsuro Okuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/524,219

(22) Filed: Mar. 13, 2000

(30) Foreign Application Priority Data

Mar. 11, 1999 (JP) .......................... 11-065264

(51) Int. Cl.[7] .............. H01S 5/00; H01S 3/03; H01S 3/06; H01S 3/08
(52) U.S. Cl. .............. 372/96; 372/64; 372/66; 372/43; 372/49
(58) Field of Search .............. 372/64, 66, 36, 372/43, 49

(56) References Cited

U.S. PATENT DOCUMENTS

| 5,394,429 A | | 2/1995 | Yamada et al. | |
| 5,693,965 A | * | 12/1997 | Yamada | 257/94 |
| 5,790,580 A | * | 8/1998 | Sakata et al. | 372/50 |

* cited by examiner

Primary Examiner—Paul Ip
Assistant Examiner—Armando Rodriguez
(74) Attorney, Agent, or Firm—Choate, Hall & Stewart

(57) ABSTRACT

In a distributed feedback semiconductor laser having at least an active layer and a diffraction grating on a semiconductor substrate and so constructed that a current is injected uniformly over an axial direction of a resonator, a bandgap wavelength of the active layer in the neighborhood of a light outputting end or a backward end opposite to the light outputting end, is shorter than that in the other region of the active layer along the axial direction of the resonator.

18 Claims, 8 Drawing Sheets

DISTRIBUTED FEEDBACK SEMICONDUCTOR LASER

BACKGROUND OF THE INVENTION

The present invention relates to a distributed feedback semiconductor laser, and more specifically to a distributed feedback semiconductor laser having an excellent single mode operation stability in a wide temperature range.

A distributed feedback semiconductor laser (DFB semiconductor laser) is used as a light source for a long-distance, large-capacity optical communication. Recently, it has been studied to use the DFB semiconductor laser for a relatively short distance communication. In this application, it is necessary to reduce the cost of a DFB semiconductor laser module, and therefore, a demand for a DFB semiconductor laser operating without a temperature maintaining instrument which was incorporated in a prior art DFB semiconductor laser module, is increasing.

For this purpose, a DFB semiconductor laser having an active layer of a strained multiple quantum well structure has been developed, which has a high-temperature operation characteristics more excellent than that of a semiconductor laser having a prior art bulk active layer.

In the DFB semiconductor laser having the active layer of the strained multiple quantum well structure, however, a gain spectrum has a large temperature dependency. In addition, when the DFB semiconductor laser is operated at a high temperature or at a low temperature, a single mode oscillation does not occur. The reason for this is considered that for the change of temperature, the amount of change in a Bragg wavelength is larger than the amount of change in a bandgap wavelength, with the result that the Bragg wavelength comes out of a wavelength range in which the Bragg wavelength exerts the gain.

BRIEF SUMMARY OF THE INVENTION

Accordingly, it is an object of the present invention to provide a DFB semiconductor laser which has overcome the above mentioned problem of the prior art.

Another object of the present invention is to provide a DFB semiconductor laser oscillating in a stable single mode with a wide temperature range.

The above and other objects of the present invention are achieved in accordance with the present invention by a distributed feedback semiconductor laser having at least an active layer and a diffraction grating on a semiconductor substrate and so constructed that a current is injected uniformly over an axial direction of a resonator, wherein a bandgap wavelength of the active layer in the neighborhood of a light outputting end or a backward end opposite to the light outputting end, is shorter than in the other region of the active layer along the axial direction of the resonator.

According to a second aspect of the present invention, there is provided a distributed feedback semiconductor laser having at least an active layer and a diffraction grating on a semiconductor substrate and so constructed that a current is injected uniformly over an axial direction of a resonator, wherein a bandgap wavelength of the active layer both in the neighborhood of a light outputting end and in the neighborhood of a backward end opposite to the light outputting end, is shorter than that in the other region of the active layer along the axial direction of the resonator.

According to a third aspect of the present invention, there is provided a distributed feedback semiconductor laser having at least an active layer and a diffraction grating on a semiconductor substrate and so constructed that a current is injected uniformly over an axial direction of a resonator, wherein the active layer includes, along the axial direction of the resonator, a constant bandgap wavelength region and a changing region where a bandgap wavelength gradually shortens from the constant bandgap wavelength region towards a light outputting end and/or a backward end opposite to the light outputting end.

According to a fourth aspect of the present invention, there is provided a distributed feedback semiconductor laser having at least an active layer and a diffraction grating on a semiconductor substrate and so constructed that a current is injected uniformly over an axial direction of a resonator, wherein the active layer includes, along the axial direction of the resonator, a longest bandgap wavelength position and a changing region where a bandgap wavelength gradually shortens from the longest bandgap wavelength position towards a light outputting end and/or a backward end opposite to the light outputting end.

According to a fifth aspect of the present invention, there is provided a distributed feedback semiconductor laser having at least an active layer and a diffraction grating on a semiconductor substrate and so constructed that a current is injected uniformly over an axial direction of a resonator, comprising a window region at a light outputting end and a bandgap wavelength changing region where a bandgap wavelength of the active layer gradually changes along the axial direction of the resonator, the bandgap wavelength changing region being adjacent to the window region.

In at least a portion of the bandgap wavelength changing region, a modulation region is preferably provided in which the period of the diffraction grating is modulated with the change of the refractive index in the active layer.

The above and other objects, features and advantages of the present invention will be apparent from the following description of preferred embodiments of the invention with reference to the accompanying drawings.

DETAILED DESCRIPTION OF THE INVENTION

Figure 1:
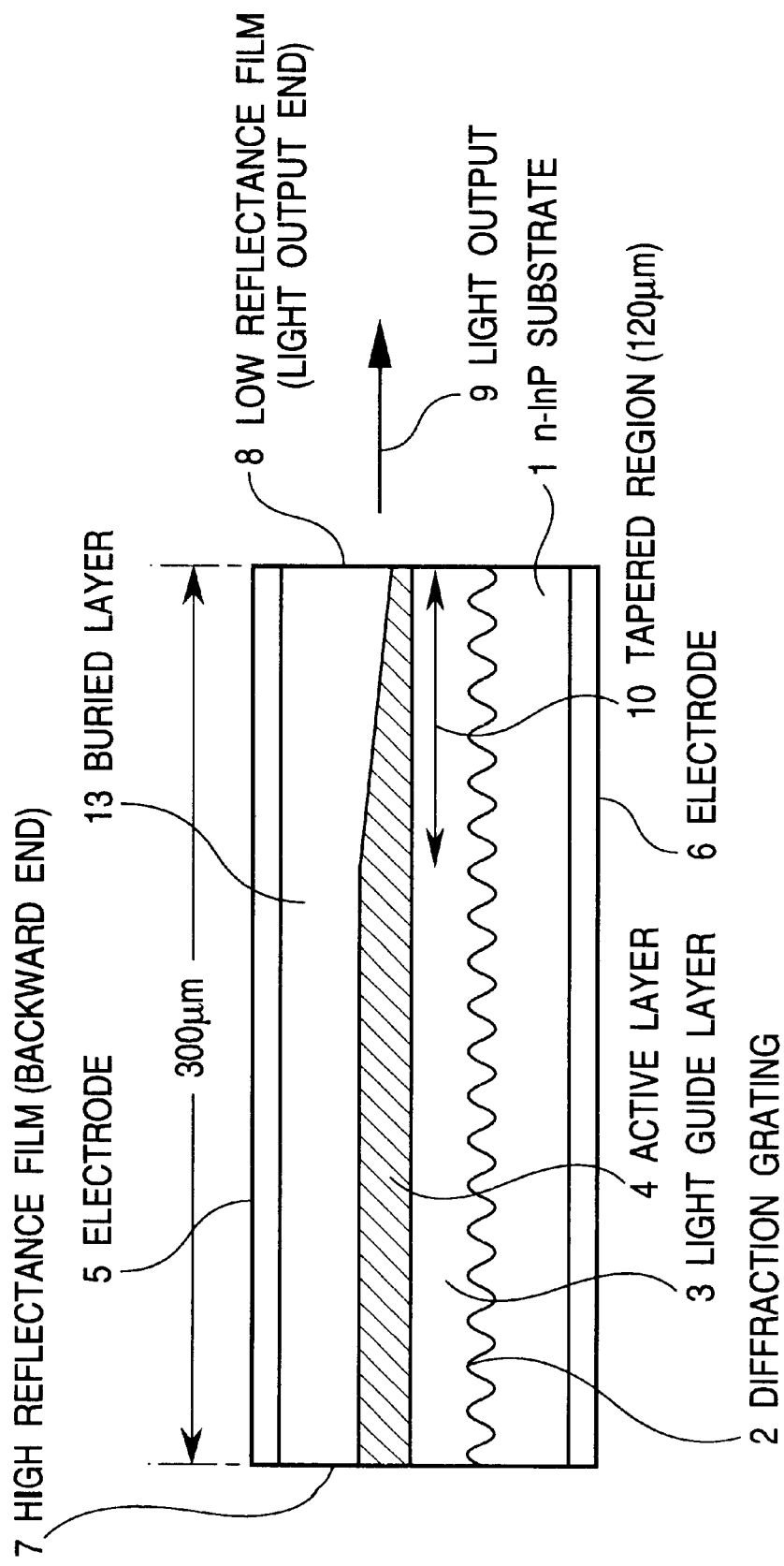
FIG. 1 is a diagrammatic sectional view of a first embodiment of the DFB semiconductor laser in accordance with the present invention.

Referring to FIG. 1, there is shown a diagrammatic sectional view of a first embodiment of the DFB semiconductor laser in accordance with the present invention.

As shown in FIG. 1, the shown embodiment includes a diffraction grating 2, a light guide layer 3, an active layer 4 and a buried layer 13, which are formed in the named order on a semiconductor substrate formed of an n-InP substrate 1. An assembly thus formed is sandwiched between an upper electrode 5 and a lower electrode 6. One end of a resonator in its axial direction constitutes a light output end, which is coated with a low reflectance film 8, and the other end (called a "backward end" in this specification) is coated with a high reflectance film 7. Thus, a resonator is constituted. In addition, a current is injected uniformly over the whole length of the resonator in an axial direction through the upper electrode 5 and the lower electrode 6, so that an light output 9 is emitted through the low reflectance film 8. In the embodiment shown in FIG. 1, the active layer 4 has a tapered region 10 where a layer thickness of the active layer 4 gradually reduces toward the light output end 8.

The above mentioned arrangement can gradually shorten a bandgap wavelength of the active layer 4 toward light output end 8.

Figure 2A:
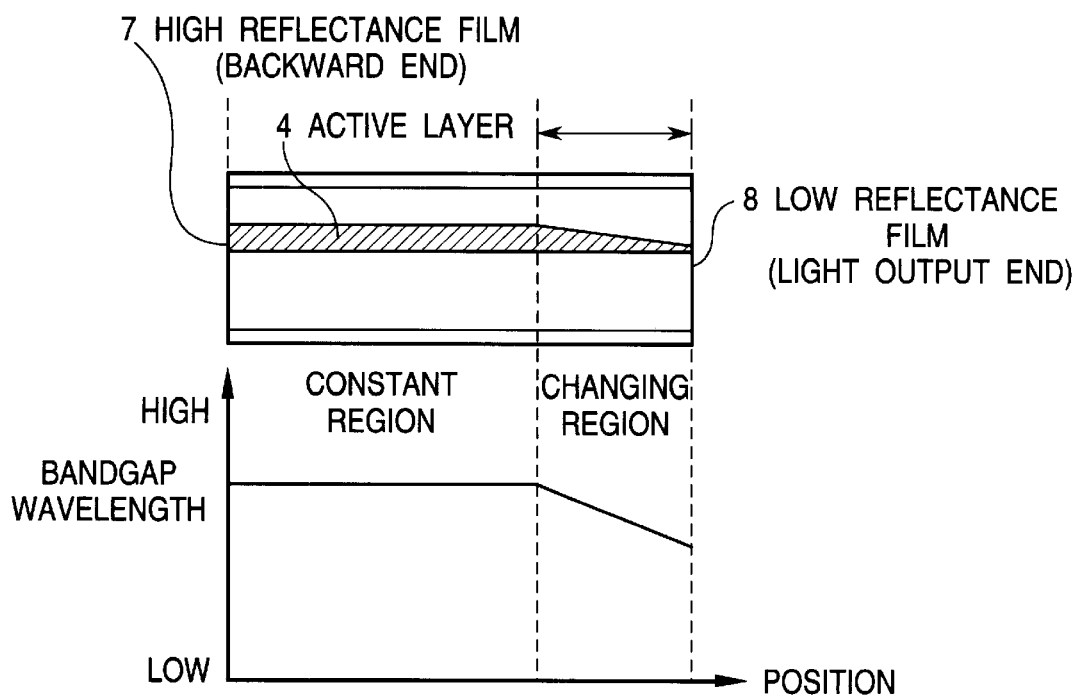
FIGS. 2A and 2B illustrate a position dependency of the bandgap wavelength in the active layer in the DFB semiconductor laser shown in FIG. 1, and a wavelength dependency of the gain in the DFB semiconductor laser.

FIG. 2A illustrates a position dependency of the bandgap wavelength in the active layer in the DFB semiconductor laser shown in FIG. 1. As seen from FIG. 2A, the bandgap wavelength is at constant from an center region in the axial direction of the resonator to the backward end 7, but the bandgap wavelength of the active layer gradually reduces in a region near to the light outputting end 8.

Figure 2B:
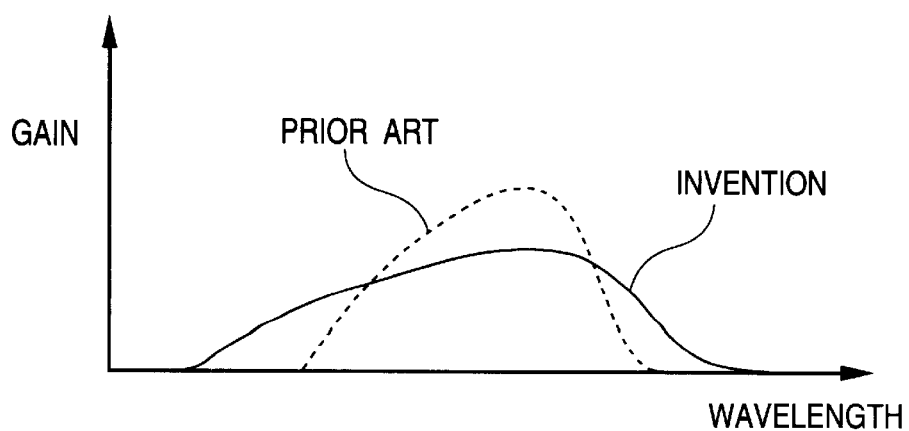

A wavelength dependency of the gain in this DFB semiconductor laser is shown in FIG. 2B. In the DFB semiconductor laser in accordance with the present invention, since the bandgap wavelength of the active layer is not uniform along the axial direction of the resonator, as seen from FIG. 2B, the range of the wavelength in which the gain is obtained is widened in comparison with a DFB semiconductor laser having a uniform bandgap wavelength of the active layer along the axial direction. With this arrangement, when the bandgap wavelength of the active layer in the DFB semiconductor laser changed because of a change in temperature, since the wavelength spectrum which can obtain the gain is wide, even if a difference between the bandgap wavelength and the Bragg wavelength becomes large, the Bragg wavelength never comes out of the wavelength range which can obtain the gain. As a result, a stable single mode oscillation characteristics can be obtained.

In the embodiment shown in FIG. 1, the tapered region 10, namely, a bandgap wavelength changing region is formed in the neighborhood of the light output end 8, but can be formed in the neighborhood of the backward end 7. This would be a matter of course to persons skilled in the art.

Figure 8A:
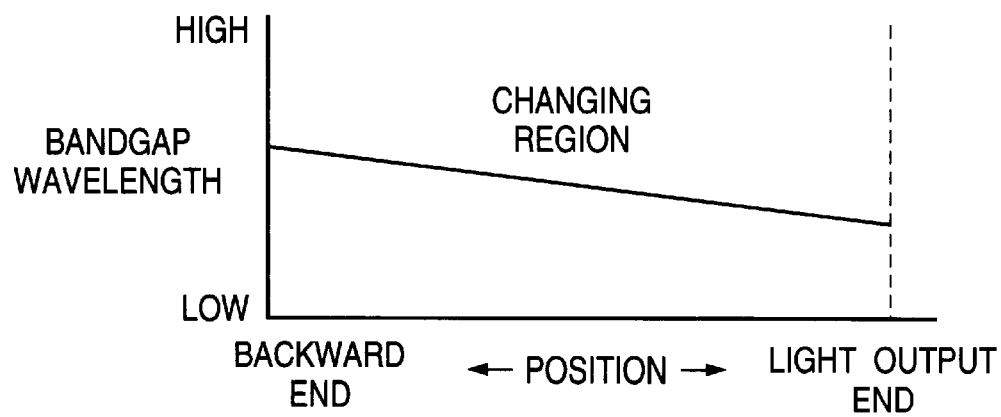
FIGS. 8A, 8B and 8C diagrammatically illustrate a position dependency in the bandgap wavelength of the DFB semiconductor laser in accordance with the present invention.
Figure 8B:
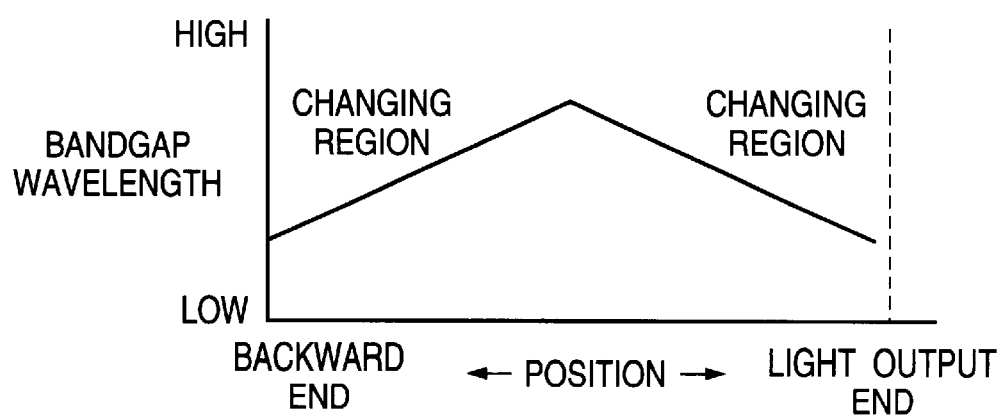
Figure 8C:
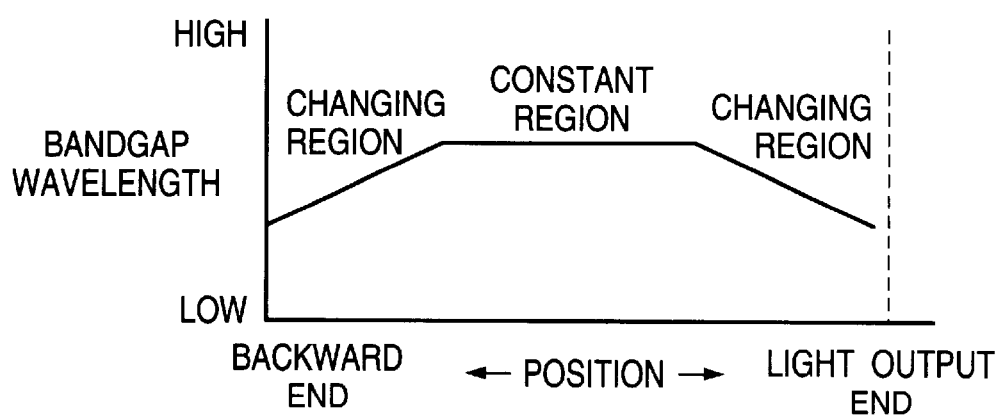

In the present invention, the above mentioned change of the bandgap wavelength can be divided into three cases shown in FIGS. 8A, 8B and 8C. In the case shown in FIG. 8A, the bandgap wavelength gradually changes over the whole length of the axial direction of the resonator. In the case shown in FIG. 8B, a central region of the axial direction of the resonator includes a position where the bandgap wavelength is the longest, and the bandgap wavelength gradually reduces from the longest bandgap wavelength position towards both the opposite ends of the resonator In the case shown in FIG. 8C, a central region of the axial direction of the resonator includes a region where the bandgap wavelength is at a constant, and the bandgap wavelength gradually reduces from the constant bandgap wavelength region towards both the opposite ends of the resonator. Here, in the case shown in FIG. 8A, the bandgap wavelength gradually reduces from the backward end to the light output end over the whole length of the axial direction of the resonator. However, even if the bandgap wavelength gradually reduces from the light output end to the backward end, a similar advantage can be obtained. This would be a matter of course to persons skilled in the art.

Furthermore, in the case of forming, by use of selective growth, an active layer structure in which the bandgap wavelength gradually reduces towards the backward end or the light output end as shown in FIG. 1, the layer thickness of the active layer reduces in accordance with the reduction of the bandgap wavelength. In this case, another advantage can be simultaneously obtained in which the light confining effect becomes weak in a region in the neighborhood of the light output end, so that a radiation angle is reduced.

In the prior art, when the active layer is used in combination with a window structure in order to sufficiently reduce the reflectance at the light output end, both a region having the active layer and another region having no active region co-exist along the axial direction of the resonator. In this case, at a boundary between the region where the active layer is grown and the region where the active layer is not grown, a rapid layer thickness change cannot be necessarily obtained. In some case, there is formed a transition region in which the layer thickness and the composition change over a relatively long region because of a growth condition. In an extreme case, a notch is formed in the active layer at the transition region. The reason of this is considered that the transition region and the notch are generated since the selective growth is used for forming the active layer, with the result that the boundary between the region where the active layer is grown and the region where the active layer is not grown, is influenced sensitively by a growth condition. The long transition region and the notch formed in the active layer often deteriorate repeatability of a uniform device characteristics.

For the above mentioned problem, if the tapered region in which the bandgap wavelength of the active layer gradually reduces, is formed in the active layer at least in the neighborhood of the window region. namely, the light output end, it is possible to elevate controllability of the bandgap wavelength in the active layer in a region in the neighborhood of the window region. This bandgap wavelength changing region can be formed in the neighborhood of the window region or over the whole length or a portion of the axial direction.

Furthermore, in each of the cases mentioned above, a manner of changing the bandgap wavelength of the active layer is determined in accordance with a required gain characteristics, and therefore, is not limited to a specific manner. For example, it is possible to linearly reduce the bandgap wavelength as shown in FIG. 2A. However, it is more preferred that the rate of reduction in the bandgap wavelength is maximum at a change starting point (a longest bandgap wavelength point of the bandgap wavelength changing region), and gradually reduces to a shortest bandgap wavelength point of the bandgap wavelength changing region. This can be realized by an n-th order function (for example, quadratic function and cubic function) or an exponential function. According to this manner, it is possible to reduce the radiation angle with a relatively short tapered region length.

On the other hand, when the bandgap wavelength of the active layer is changed in the axial direction of the resonator, an equivalent refractive index of the active layer simultaneously changes. Accordingly, in a further preferred embodiment of the present invention, there is provided a modulation region in which the period of a diffraction grating is caused to change in accordance with the change of the equivalent refractive index of the active layer. With this arrangement, a uniform Bragg wavelength can be obtained over the axial direction of the resonator, and therefore, a further excellent single mode oscillation stability can be obtained. Here, the "equivalent refractive index" can be defined to mean a refractive index when a light guide of a multi-layer structure is considered to be formed of only one medium.

More specifically, a relation of {Bragg wavelength}=2×{period of diffraction grating}×{equivalent refractive index} holds. On the other hand, the thinner the thickness of the active layer is, the equivalent refractive index decreases. Therefore, in order to compensate for the this reduction of the equivalent refractive index so as to maintain the Bragg wavelength at a constant, it is sufficient if the period of the diffraction grating is elongated with the reduction of the thickness of the active layer. In this connection, the equivalent refractive index in the tapered region can be calculated from for example a sectional shape of the active layer.

This modulation region of the diffraction grating can be provided over the whole of the diffraction grating or a portion of the diffraction grating. In this case, the region of the diffraction grating is not less than one third (⅓) of the resonator length, and more preferably, about two thirds (⅔) of the resonator length.

Now, a process for fabricating the first embodiment of the DFB semiconductor laser in accordance with the present invention will be described with FIG. 1 and FIG. 3, which illustrates a process for fabricating the DFB semiconductor laser in accordance with the present invention.

After the diffraction grating 2 is formed on the n-InP substrate 1, the light guide layer 3 and the active layer 4 are formed in the named order by a selective growth. In this case, the light guide layer 3 can be formed in the diffraction grating 2, and then, the active layer 4 can be formed by the selective growth.

Figure 3:
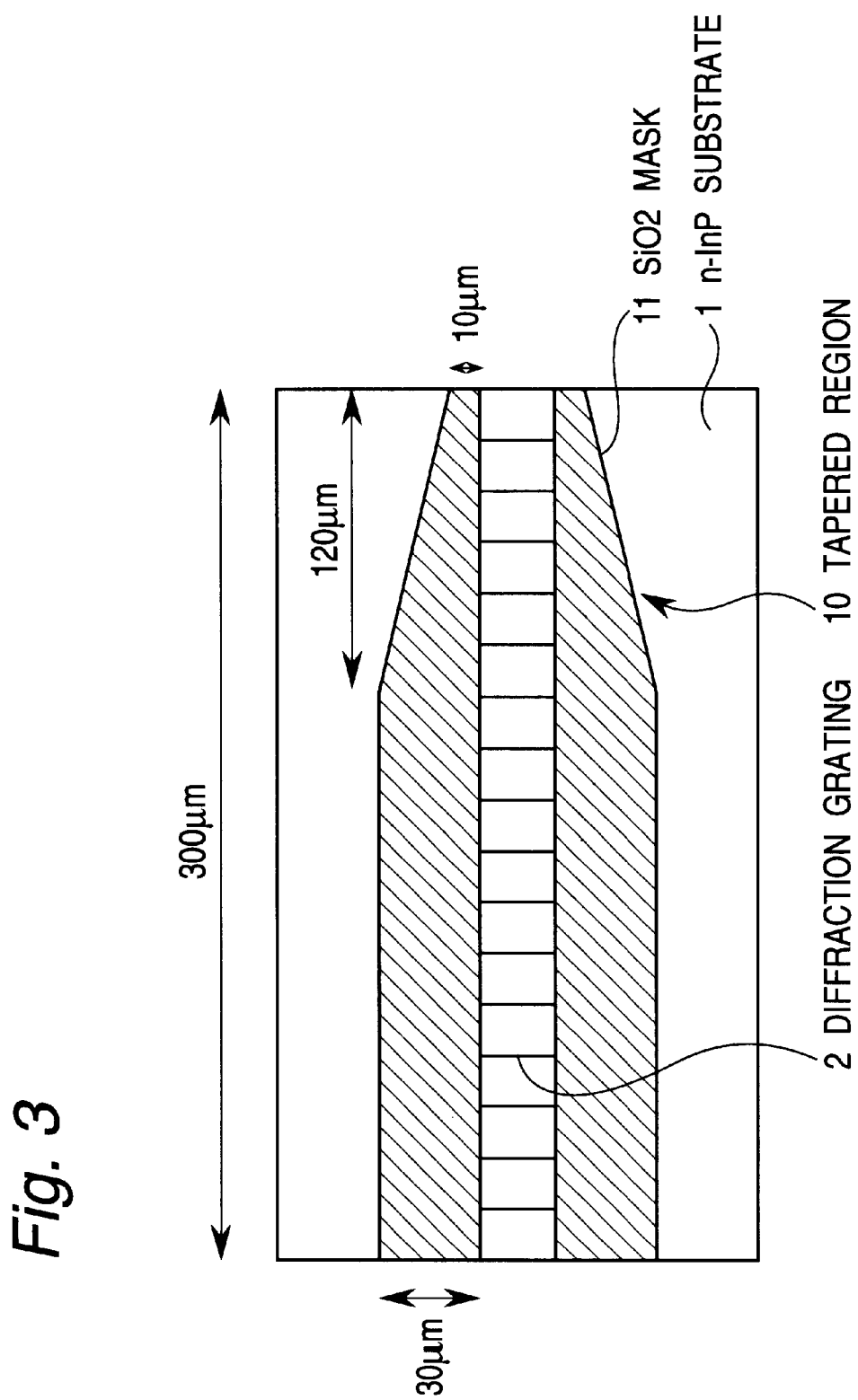
FIG. 3 illustrates a process for fabricating the DFB semiconductor laser in accordance with the present invention.

An insulating film pattern used for the selective growth is shown in FIG. 3, which shows a mask pattern for only one device. A SiO$_2$ mask pattern 11 is formed at each side of the diffraction grating 2. Here, in a region over the distance of 120 µm from the light output end, the mask pattern 11 is formed in a tapered shape in such a manner that the width of the mask pattern reduces from 30 µm to 10 µm. On a wafer having the insulating film mask pattern, the active layer 4 is grown by use of a MOVPE (metal organic vapor phase epitaxy), with the result that the tapered region 10 having the layer thickness reducing toward the light output end, is formed. In this tapered region 10, the bandgap wavelength linearly reduces as shown in FIG. 2A.

In the shown mask pattern, the nearer it is to the light output end, the bandgap wavelength shortens and the layer thickness reduces. In a case of a 1.5 µm band laser, it is designed that, at a room temperature, the constant bandgap region has a bandgap wavelength of 1.56 µm, the bandgap wavelength at the light output end is 1.53 µm, and the Bragg wavelength is 1.55 µm.

The light guide 3 formed under the active layer can be formed by a whole growth (without using the mask for the selective growth) after the diffraction grating 2 is formed. Alternatively, the light guide 3 can be formed by the selective growth by using the same mask as that used for forming the active layer. After the active layer is formed, the SiO$_2$ mask is removed, and p-InP is deposited to form a buried layer 13. For the wafer thus obtained, the upper electrode 5 and the lower electrode 6 are formed by a conventional electrode formation process, and the wafer is cut into individual DFB semiconductor lasers. The light output end face of each DFB semiconductor laser is coated with the low reflectance film 8, and the other end face is coated with the high reflectance film 7. Thus, the DFB semiconductor laser is completed, a sectional view of which is shown in FIG. 1.

A detail of a basic process for fabricating the DFB semiconductor laser is shown in U.S. Pat. No. 5,394,429 patented for an invention co-invented by the inventor of this application and others, the content of which is incorporated by reference in its entirety into this application.

The DFB semiconductor laser thus fabricated was evaluated. A stable single mode oscillation could be obtained in which a sub-mode suppression ratio is 40 dB in a temperature range from −40 degree Celsius to 85 degree Celsius. The radiation angle was 20 degrees both in a horizontal plane and in a vertical plane, which is narrower than the DFB semiconductor having the conventional active layer.

Figure 4:
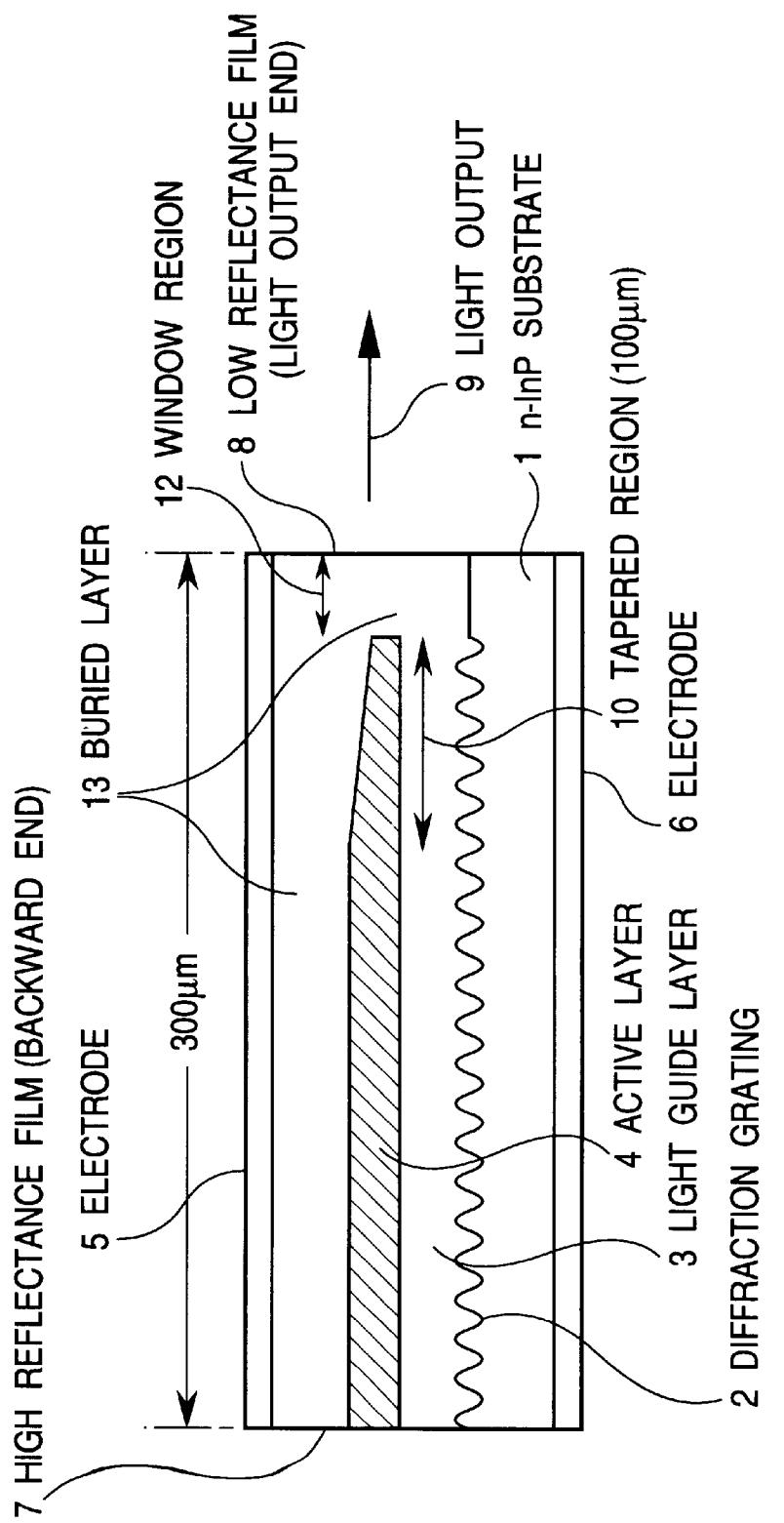
FIG. 4 is a diagrammatic sectional view of a second embodiment of the DFB semiconductor laser in accordance with the present invention.

Referring to FIG. 4, there is shown a diagrammatic sectional view of a second embodiment of the DFB semiconductor laser in accordance with the present invention. In FIG. 4, elements corresponding to those shown in FIG. 1 are given the same reference numbers, and explanation will be omitted.

The second embodiment is different from the first embodiment in that a window region 12 having neither the active layer 4 nor the diffraction grating 2 is formed adjacent to the light output end 8. With this window structure, it is possible to reduce the reflectance factor of the light output end with a high degree of controllability, thereby to improve the yield of production of the single mode oscillation laser.

On the other hand, since the window region was used in combination with the active region which is formed by a selective growth, an abrupt changing region exists between an active layer region where the active layer is grown and the window region where the active layer is not grown. In this changing region, the layer thickness and the composition of the active layer become unstable. In some condition, an abnormal growth such as a notch occurs in the active layer. In this embodiment, however, since the active layer is formed to have the tapered region in the neighborhood of the window region, it is possible to suppress the abnormal growth of the active layer in the neighborhood of the window region, which occurs when the window region was combined with the active layer which is formed by the selective growth. In addition, the thickness and the bandgap length of the active layer in the tapered region can be controlled with a high controllability and repeatability, In this embodiment, the window region 12 was formed over the distance of 10 µm from the light output end 8, and the tapered region 10 was formed over the distance of 100 µm from the window region 12 toward a center of the axial direction of the resonator. The rate of change of the bandgap wavelength is similar to that in the first embodiment.

An evaluation was carried out, similarly to the first embodiment. A single mode oscillation having the sub-band suppression ratio of 40 dB was obtained. The radiation angle was reduced to 20 degrees, while a conventional laser having no tapered region was about 30 degrees. The yield of production of the single mode oscillation laser could be improved to about 1.2 times in comparison with a conventional laser having no window region.

Figure 5:
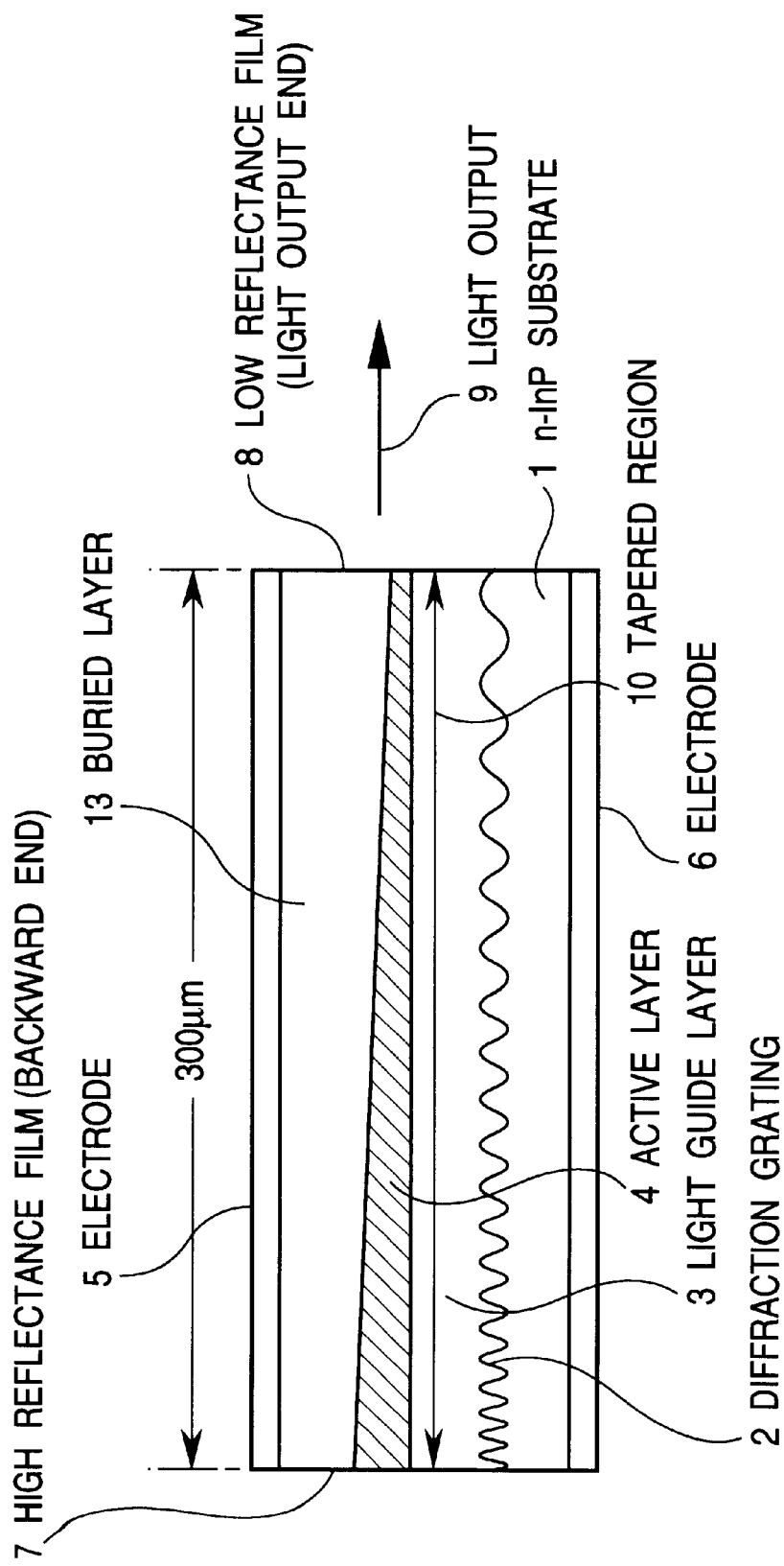
FIG. 5 is a diagrammatic sectional view of a third embodiment of the DFB semiconductor laser in accordance with the present invention.

Referring to FIG. 5, there is shown a diagrammatic sectional view of a third embodiment of the DFB semiconductor laser in accordance with the present invention. In FIG. 5, elements corresponding to those shown in FIG. 1 are given the same reference numbers, and explanation will be omitted.

This embodiment is different from the first embodiment in that the tapered region is formed over the entire length of the resonator, and in that the period of the diffraction grating is modulated in accordance with the reduction of the equivalent refractive index caused with the reduction of the thickness of the active layer.

The nearer it is to the light output end, the equivalent refractive index becomes small. Therefore, in order to compensate for the this reduction of the equivalent refractive index, the diffraction grating is formed to elongate the period of the diffraction grating in accordance with the reduction of the equivalent refractive index, namely, the reduction of the thickness of the active layer. The diffraction grating having the period modulated as mentioned above, can be easily formed by a recent electron beam exposure process.

The DFB semiconductor laser of this embodiment was fabricated so that the rate of change of the bandgap wavelength is similar to that in the first embodiment and the period of the diffraction grating is modulated to have a uniform Bragg wavelength along the axial direction of the resonator.

An evaluation was carried out, similarly to the first embodiment. A single mode oscillation having the sub-band suppression ratio of 40 dB was obtained. The radiation angle was reduced to 20 degrees, while a conventional laser having no tapered region was about 30 degrees. The yield of production of the single mode oscillation laser could be improved to about 1.5 times in comparison with a laser having no diffraction grating modulation.

Figure 6:
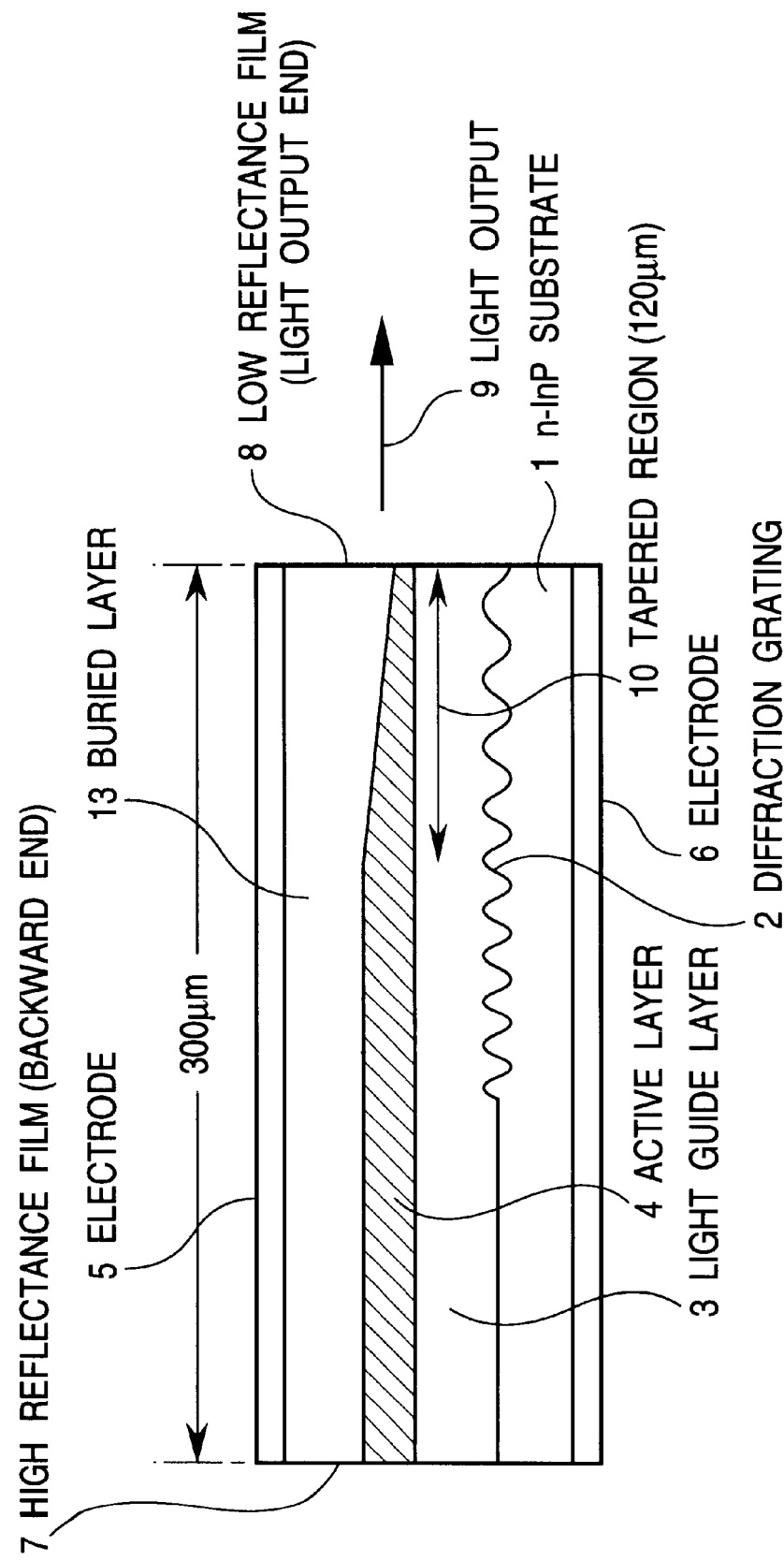
FIG. 6 is a diagrammatic sectional view of a fourth embodiment of the DFB semiconductor laser in accordance with the present invention.

Referring to FIG. 6, there is shown a diagrammatic sectional view of a fourth embodiment of the DFB semiconductor laser in accordance with the present invention. In FIG. 6, elements corresponding to those shown in FIG. 1 are given the same reference numbers, and explanation will be omitted.

This embodiment is different from the first embodiment in which the diffraction grating is provided in only one portion at the light output end side in the axial direction of the resonator and in which the period of the diffraction grating formed in the tapered region is modulated to become long in accordance with the reduction of the equivalent refractive index of the light guide in the tapered region.

Specifically, the diffraction grating is formed over only a region of about 60% in the axial direction length of the resonator. In the tapered region of the active layer, the period of the diffraction grating Gradually becomes long. The period of the diffraction grating is modulated to have a uniform Bragg wavelength, similarly to the third embodiment.

In this embodiment having the diffraction grating provided in only one portion of the resonator in the axial direction, the yield of production of the single mode oscillation laser can be improved.

An evaluation was carried out, similarly to the first embodiment. A single mode oscillation having the sub-band suppression ratio of 40 dB was obtained. The radiation angle was reduced to 20 degrees, while a conventional laser having no tapered region was about 30 degrees. The yield of production of the single mode oscillation laser could be improved to about 1.5 times in comparison with a laser having no diffraction grating modulation.

Figure 7:
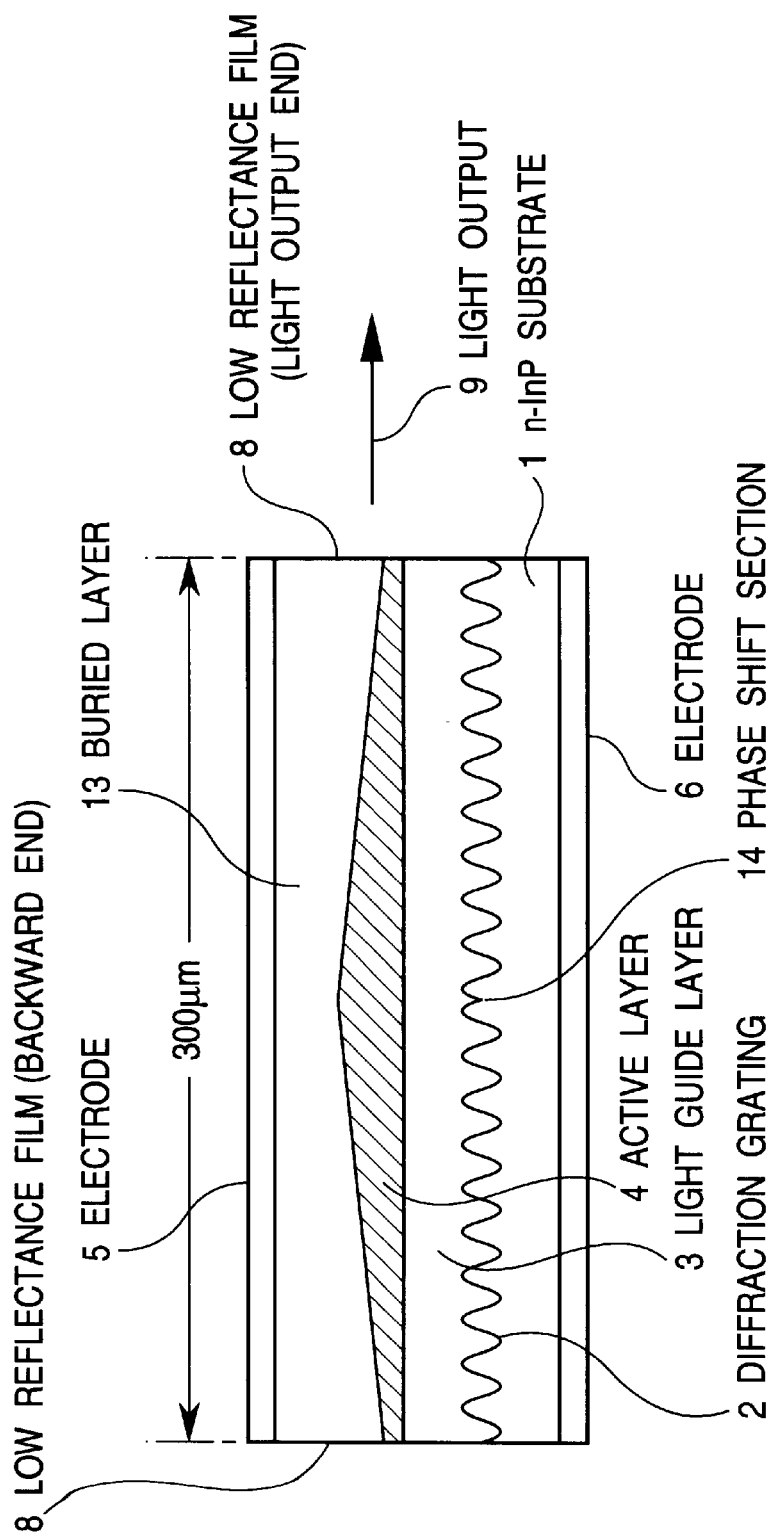
FIG. 7 is a diagrammatic sectional view of a fifth embodiment of the DFB semiconductor laser in accordance with the present invention.

Referring to FIG. 7, there is shown a diagrammatic sectional view of a fifth embodiment of the DFB semiconductor laser in accordance with the present invention. In FIG. 7, elements corresponding to those shown in FIG. 1 are given the same reference numbers, and explanation will be omitted.

The fifth embodiment is a $\lambda/4$ phase shift type DFB semiconductor laser having a $\lambda/4$ phase shift section 14 at a center portion in an axial direction of the resonator.

In this fifth embodiment, the layer thickness of the active layer is maximum at the position of the $\lambda/4$ phase shift section 14, and therefore, has the longest bandgap wavelength at the position of the $\lambda/4$ phase shift section 14. The bandgap wavelength gradually reduces towards both the light output end and the backward end.

As seen from the fifth embodiment, the present invention can be applied to the $\lambda/4$ phase shift type DFB semiconductor laser. A similar advantage can be obtained by the active layer having the bandgap wavelength changing in symmetry to the center of the resonator.

An evaluation was carried out, similarly to the first embodiment. A single mode oscillation having the sub-band suppression ratio of 50 dB was obtained. The radiation angle was reduced to 20 degrees, while a conventional laser having no tapered region was about 30 degrees. The yield of production of the single mode oscillation laser could be improved to about 1.5 times in comparison with a laser having no diffraction grating modulation.

As seen from the above, according to the present invention, a DFB semiconductor laser oscillating in a stable single mode over a wide temperature range can be obtained by widening the gain wavelength spectrum width in the DFB semiconductor laser having the active layer formed by the selective growth.

The reason for this is that: The prior art DFB semiconductor laser includes the active layer having a uniform bandgap wavelength over the axial direction of the resonator. However, the DFB semiconductor laser in accordance with the present invention includes the active layer having the bandgap wavelength changing along the axial direction of the resonator. With this construction, the gain wavelength spectrum width becomes wide, and therefore, even if the bandgap wavelength changes in a wide temperature range, the Bragg wavelength causing the DFB semiconductor laser to oscillate never comes out of the wavelength range in which the gain can be obtained.

In the DFB semiconductor laser in accordance with the present invention, the radiation angle of the DFB semiconductor laser is reduced, and therefore, a coupling efficiency between the DFB semiconductor laser and an optical fiber can be elevated.

The reason for this is that: If the active layer is formed with the selective growth to have the bandgap wavelength of the active layer which reduces towards the light output end, the layer thickness of the active layer becomes thin in the neighborhood of the light output end, with the result that the equivalent refractive index and the light confining effect become small in the neighborhood of the light output end.

Furthermore, according to the present invention, when the window structure is formed, it is possible to control the shape of the active layer in the neighborhood of the light output end with a high degree of controllability.

The reason for this is that: At a boundary between a region in which the active layer is selectively grown and a region in which no active layer is selectively grown, it is difficult to abruptly change the composition and the layer thickness of the active layer. However, if the active layer is formed to have the tapered region in the boundary region, the shape of the active layer in the neighborhood of the boundary region favorably reflects the shape of the mask for the selective growth, so that the controllability is elevated.

The invention has thus been shown and described with reference to the specific embodiments. However, it should be noted that the present invention is in no way limited to the details of the illustrated structures but changes and modifications may be made within the scope of the appended claims.

What is claimed is:

1. A distributed feedback semiconductor laser having a substantially flat top surface, a buried layer disposed below the top surface, at least an active layer disposed under the buried layer, a light guide layer disposed below the active layer and a diffraction grating disposed on a semiconductor substrate disposed under the light guide layer, and so constructed that a current is injected uniformly over an axial direction of a resonator wherein a bandgap wavelength of the active layer in the neighborhood of a light outputting end or a backward end opposite to said light outputting end, is shorter than that in the other region of said active layer along the axial direction of the resonator, the resonator extending from a low reflectance layer disposed upon a first vertical cleaved surface on the light outputting end to a high reflectance layer disposed upon a second vertical cleaved surface on the backward end.

2. A distributed feedback semiconductor laser claimed in claim 1 wherein a vertical layer thickness of said active layer in the neighborhood of said light outputting end or said backward end, is thinner than that of said active layer in the other region along the axial direction of the resonator.

3. A distributed feedback semiconductor laser claimed in claim 1 wherein said bandgap wavelength of the active layer both in the neighborhood of said light outputting end and in the neighborhood of said backward end, is shorter than that in the other region of said active layer along the axial direction of the resonator.

4. A distributed feedback semiconductor laser claimed in claim 3 wherein a vertical layer thickness of said active layer both in the neighborhood of said light outputting end and in the neighborhood of said backward end, is thinner than that of said active layer in the other region along the axial direction of the resonator.

5. A distributed feedback semiconductor laser having a substantially flat top surface, a buried layer disposed below the top surface, at least an active layer disposed under the buried layer, a light guide layer disposed below the active layer and a diffraction grating disposed on a semiconductor substrate disposed under the light guide layer, and so constructed that a current is injected uniformly over an axial direction of a resonator, wherein the active layer includes, along the axial direction of the resonator a constant bandgap wavelength region and a bandgap wavelength changing region where a bandgap wavelength gradually shortens from the constant bandgap wavelength region towards a light outputting end and/or a backward end opposite to the light outputting end, the resonator extending from a low reflectance layer disposed upon a first vertical cleaved surface on the light outputting end to a high reflectance layer disposed upon a second vertical cleaved surface on the backward end.

6. A distributed feedback semiconductor laser claimed in claim 5, wherein in said bandgap wavelength changing region, a vertical layer thickness of said active layer gradually reduces towards said light outputting end and/or said backward end so as to gradually shorten said bandgap wavelength of said active layer towards said light outputting end and/or said backward end.

7. A distributed feedback semiconductor laser claimed in claim 6, wherein in at least a portion of said bandgap wavelength changing region, a modulation region is formed in which the period of said diffraction grating is modulated with the change of the refractive index in said active layer.

8. A distributed feedback semiconductor laser claimed in claim 5, wherein in at least a portion of said bandgap wavelength changing region, a modulation region is formed in which the period of said diffraction grating is modulated with the change of the refractive index in said active layer.

9. A distributed feedback semiconductor laser having a substantially flat top surface, a buried layer disposed below the top surface, at least an active layer disposed under the buried layer, a light guide layer disposed below the active layer and a diffraction grating disposed on a semiconductor substrate disposed under the light guide layer, and so constructed that a current is injected uniformly over an axial direction of a resonator, wherein the active layer includes, along the axial direction of the resonator, a longest bandgap wavelength position and a bandgap wavelength changing region where a bandgap wavelength gradually shortens from the longest bandgap wavelength position towards a light outputting end and/or a backward end opposite to the light outputting end, the resonator extending from a low reflectance layer disposed upon a first vertical cleaved surface on the light outputting end to a high reflectance layer disposed upon a second vertical cleaved surface on the backward end.

10. A distributed feedback semiconductor laser claimed in claim 9 wherein said longest bandgap wavelength position is positioned at a center region along the axial direction of the resonator.

11. A distributed feedback semiconductor laser claimed in claim 9 wherein in said bandgap wavelength changing region said bandgap wavelength gradually shortens from the longest bandgap wavelength position towards one of said light outputting end and said backward end, and said longest bandgap wavelength position is positioned at the other of said light outputting end and said backward end.

12. A distributed feedback semiconductor laser claimed in claim 9, wherein in said bandgap wavelength changing region, a vertical layer thickness of said active layer gradually reduces towards said light outputting end and/or said backward end so as to gradually shorten said bandgap wavelength of said active layer towards said light outputting end and/or said backward end.

13. A distributed feedback semiconductor laser claimed in claim 12, wherein in at least a portion of said bandgap wavelength changing region, a modulation region is formed in which the period of said diffraction grating is modulated with the change of the refractive index in said active layer.

14. A distributed feedback semiconductor laser claimed in claim 9, wherein in at least a portion of said bandgap wavelength changing region, a modulation region is formed in which the period of said diffraction grating is modulated with the change of the refractive index in said active layer.

15. A distributed feedback semiconductor laser having a substantially flat top surface, a buried layer disposed below the top surface, at least an active layer disposed under the buried layer, a light guide layer disposed below the active layer and a diffraction grating disposed on a semiconductor substrate disposed under the light guide layer, and so constructed that a current is injected uniformly over an axial direction of a resonator, comprising a window region at a light outputting end and a bandgap wavelength changing region where a bandgap wavelength of the active layer gradually changes along the axial direction of the resonator, said bandgap wavelength changing region being adjacent to said window region, the resonator extending from a low reflectance layer disposed upon a first vertical cleaved surface on the light outputting end to a high reflectance layer disposed upon a second vertical cleaved surface on the backward end.

16. A distributed feedback semiconductor laser claimed in claim 15, wherein in said bandgap wavelength changing region, a vertical layer thickness of said active layer gradually reduces so as to gradually shorten said bandgap wavelength of said active layer.

17. A distributed feedback semiconductor laser claimed in claim 16, wherein in at least a portion of said bandgap wavelength changing region, a modulation region is formed in which the period of said diffraction grating is modulated with the change of the refractive index in said active layer.

18. A distributed feedback semiconductor laser claimed in claim 15, wherein in at least a portion of said bandgap wavelength changing region, a modulation region is formed in which the period of said diffraction grating is modulated with the change of the refractive index in said active layer.

* * * * *